United States Patent
Cho et al.

(10) Patent No.: US 9,425,057 B2
(45) Date of Patent: *Aug. 23, 2016

(54) METHOD AND APPARATUS FOR MANUFACTURING THREE-DIMENSIONAL-STRUCTURE MEMORY DEVICE

(75) Inventors: Sung Kil Cho, Gyeonggi-do (KR); Hai Won Kim, Gyeonggi-do (KR); Sang Ho Woo, Gyeonggi-do (KR); Seung Woo Shin, Gyeonggi-do (KR); Gil Sun Jang, Chungcheongnam-do (KR); Wan Suk Oh, Gyeonggi-do (KR)

(73) Assignee: Eugene Technology Co., Ltd., Yonging-si, Gyeonggi-do (KR)

( * ) Notice: Subject to any disclaimer, the term of this patent is extended or adjusted under 35 U.S.C. 154(b) by 143 days.

This patent is subject to a terminal disclaimer.

(21) Appl. No.: 13/822,416

(22) PCT Filed: Oct. 6, 2011

(86) PCT No.: PCT/KR2011/007402
§ 371 (c)(1),
(2), (4) Date: Mar. 12, 2013

(87) PCT Pub. No.: WO2012/050321
PCT Pub. Date: Apr. 19, 2012

(65) Prior Publication Data
US 2013/0171827 A1    Jul. 4, 2013

(30) Foreign Application Priority Data
Oct. 14, 2010  (KR) .................. 10-2010-0100092

(51) Int. Cl.
*H01L 21/306*  (2006.01)
*C23C 16/458*  (2006.01)
(Continued)

(52) U.S. Cl.
CPC ...... *H01L 21/30604* (2013.01); *C23C 16/4585* (2013.01); *H01L 21/02126* (2013.01);
(Continued)

(58) Field of Classification Search
USPC ......... 257/200, 296, 314, 315, 319, 321, 324, 257/328, 331; 365/148, 185.11, 185.17, 365/185.29; 438/156, 197, 240, 259, 260, 438/262, 268, 398, 694
See application file for complete search history.

(56) References Cited

U.S. PATENT DOCUMENTS 5,304,248 A * 4/1994 Cheng et al. .................. 118/728
5,653,479 A * 8/1997 Henderson .................... 285/261
(Continued)

FOREIGN PATENT DOCUMENTS

| KR | 10-2004-0103648 A | 12/2004 |
|---|---|---|
| KR | 10-2008-0105525 A | 12/2008 |
| KR | 10-2010-0059655 A | 6/2010 |
| KR | 10-2010-0074543 A | 7/2010 |

*Primary Examiner* — Nadine Norton
*Assistant Examiner* — Erin Bergner
(74) *Attorney, Agent, or Firm* — Rabin & Berdo, P.C.

(57) ABSTRACT

A method for manufacturing a memory device having a vertical structure according to one embodiment of the present invention comprises: a step for alternatingly laminating one or more insulation layers and one or more sacrificial layers on a substrate; a step for forming a penetration hole for penetrating the insulation layer and the sacrificial layer; a step for forming a pattern for filling up the penetration hole; a step for forming an opening for penetrating the insulation layer and the sacrificial layer; and a step for removing the sacrificial layer by supplying an etchant through the opening, wherein the step for laminating the insulation layer includes a step for depositing a first silicon oxide film by supplying to the substrate at least one gas selected from the group consisting of $SiH_4$, $Si_2H_6$, $Si_3H_8$, $Si_4H_{10}$, and the step for laminating the sacrificial layer includes a step for depositing a second silicon oxide film by supplying dichlorosilane ($SiCl_2H_2$) to the substrate.

8 Claims, 12 Drawing Sheets

(51) Int. Cl.
*H01L 21/02* (2006.01)
*H01L 21/311* (2006.01)
*H01L 27/115* (2006.01)
*H01L 29/66* (2006.01)
*H01L 29/792* (2006.01)
*H01L 21/67* (2006.01)

(52) U.S. Cl.
CPC .... *H01L21/02129* (2013.01); *H01L 21/02164* (2013.01); *H01L 21/02211* (2013.01); *H01L 21/02271* (2013.01); *H01L 21/31111* (2013.01); *H01L 21/67069* (2013.01); *H01L 27/11578* (2013.01); *H01L 27/11582* (2013.01); *H01L 29/66833* (2013.01); *H01L 29/7926* (2013.01)

(56) References Cited

U.S. PATENT DOCUMENTS

| | | | | |
|---|---|---|---|---|
| 5,766,994 | A * | 6/1998 | Tseng | 438/254 |
| 6,015,735 | A * | 1/2000 | Shue et al. | 438/254 |
| 6,566,278 | B1 * | 5/2003 | Harvey et al. | 438/778 |
| 8,148,763 | B2 | 4/2012 | Kim et al. | |
| 2005/0095770 | A1 * | 5/2005 | Kumagai et al. | 438/202 |
| 2009/0121271 | A1 * | 5/2009 | Son et al. | 257/315 |
| 2010/0128509 | A1 | 5/2010 | Kim et al. | |
| 2010/0155818 | A1 * | 6/2010 | Cho et al. | 257/324 |

* cited by examiner

METHOD AND APPARATUS FOR MANUFACTURING THREE-DIMENSIONAL-STRUCTURE MEMORY DEVICE

TECHNICAL FIELD

The present invention disclosed herein relates to a method and apparatus for manufacturing a memory device, and more particularly, to a method and apparatus for manufacturing a memory device having a three-dimensional structure.

BACKGROUND ART

Even though electronics are getting smaller, high-capacity data processing is required. Thus, it is necessary to improve a degree of integration of a memory device while reducing a volume of the memory device used in electronics. In this point, a memory device having a three-dimensional structure instead of a conventional planar structure is being considered.

DISCLOSURE OF THE INVENTION

Technical Problem

An object of the present invention provides a method and apparatus for manufacturing a memory device of which a volume can be reduced.

Another object of the present invention provides a method and apparatus for efficiently manufacturing a memory device having a three-dimensional structure.

Further another object of the present invention provides a method and apparatus for manufacturing a memory device which can prevent a substrate from being deformed by a stress difference between thin films in a process of depositing the plurality of thin films.

Further another object of the present invention will become evident with reference to following detailed descriptions and accompanying drawings.

Technical Solution

Embodiments of the present invention provide methods for manufacturing a semiconductor device having a 3-dimensional structure, the method including: alternately stacking at least one insulation layer and at least one sacrificial layer on a substrate; forming a through hole passing through the insulation layer and the sacrificial layer; forming a pattern filling the through hole; forming an opening passing through the insulation layer and the sacrificial layer; and supplying an etchant through the opening to remove the sacrificial layer, wherein the stacking of the insulation layer includes supplying at least one gas selected from the group including $SiH_4$, $Si_2H_6$, $Si_3H_8$, and $Si_4H_{10}$ onto the substrate to deposit a first silicon oxide, and the stacking of the sacrificial layer includes supplying dichlorosilane ($SiCl_2H_2$) onto the substrate to deposit a second silicon oxide.

In some embodiments, the insulation layer and the sacrificial layer may have etch selectivity with respect to the etchant, and the sacrificial layer may have an etch rate greater by about 5 times to about 300 times than that of the insulation layer.

In other embodiments, the etchant may include one of an HF solution and a buffered oxide etch (BOE) solution.

In still other embodiments, the stacking of the insulation layer may further include supplying an ethyl-based gas, and the first silicon oxide may be a silicon carbon oxide (SiCO).

In even other embodiments, the stacking of the insulation layer may further include supplying a methyl-based gas, and the first silicon oxide may be a silicon carbon oxide (SiCO).

In yet other embodiments, the substrate may be maintained at a temperature of about 300° C. to about 790° C., and the substrate may be maintained at a process pressure of about 10 mTorr to about 250 Torr.

In further embodiments, the first and second silicon oxides may have different thicknesses.

In still further embodiments, the alternately stacking of the insulation layer and the sacrificial layer may further include pressing an edge part of the substrate by using an edge ring.

In even further embodiments, the edge part of the substrate may correspond to a range of about 0.5 mm to about 3 mm from an edge of the substrate toward the inside of the substrate.

In yet further embodiments, the edge ring may be formed of a ceramic material.

In other embodiments of the present invention, methods for manufacturing a semiconductor device having a 3-dimensional structure include: alternately stacking at least one insulation layer and at least one sacrificial layer on a substrate; forming a through hole passing through the insulation layer and the sacrificial layer; forming a pattern filling the through hole; forming an opening passing through the insulation layer and the sacrificial layer; and supplying an etchant through the opening to remove the sacrificial layer, wherein the stacking of the insulation layer includes supplying at least one gas selected from the group including $SiH_4$, $Si_2H_6$, $Si_3H_8$, and $Si_4H_{10}$ onto the substrate to deposit a first silicon oxide, and the stacking of the sacrificial layer includes supplying at least one gas selected from the group including $SiH_4$, $Si_2H_6$, $Si_3H_8$, $Si_4H_{10}$, and dichlorosilane ($SiCl_2H_2$) and at least one gas selected from the group including $B_2H_6$ and $PH_3$ onto the substrate to deposit a second silicon oxide in which boron or phosphorus is injected.

In still other embodiments of the present invention, apparatuses for manufacturing a semiconductor device having a 3-dimensional structure by alternately stacking at least one insulation layer and at least one sacrificial layer on a substrate include: a chamber in which processes with respect to the substrate is performed; a substrate support disposed within the chamber and on which the substrate is placed; and a showerhead supplying at least one gas selected from the group including $SiH_4$, $Si_2H_6$, $Si_3H_8$, and $Si_4H_{10}$ onto the substrate when an insulation layer is stacked on the substrate and supplying dichlorosilane ($SiCl_2H_2$) onto the substrate when a sacrificial layer is stacked on the substrate.

In even other embodiments of the present invention, apparatuses for manufacturing a semiconductor device having a 3-dimensional structure by alternately stacking at least one insulation layer and at least one sacrificial layer on a substrate include: a chamber in which processes with respect to the substrate is performed; a substrate support disposed within the chamber and on which the substrate is placed; and a showerhead supplying at least one gas selected from the group including $SiH_4$, $Si_2H_6$, $Si_3H_8$, and $Si_4H_{10}$ onto the substrate when an insulation layer is stacked on the substrate and supplying at least one gas selected from the group including $SiH_4$, $Si_2H_6$, $Si_3H_8$, $Si_4H_{10}$, and dichlorosilane ($SiCl_2H_2$) and at least one gas selected from the group including $B_2H_6$ and $PH_3$ onto the substrate when a sacrificial layer is stacked on the substrate.

Advantageous Effects

According to the embodiments of the present invention, the memory device may have the three-dimensional structure to reduce the volume of the memory device. Also, after the insulation layer and the sacrificial layer are alternately stacked on the substrate, the sacrificial layer may be effectively removed by the pattern such as the polysilicon thin film used as a channel of the semiconductor transistor in the state where the insulation layer is supported. Also, it may prevent the substrate from being deformed by the stress difference between the thin films in the process for depositing the plurality of thin films.

BEST MODE FOR CARRYING OUT THE INVENTION

FIGS. 1 to 6 are schematic cross-sectional views illustrating a method for manufacturing a memory device according to an embodiment of the present invention. Hereinafter, a method for manufacturing a memory device will be described with reference to FIGS. 1 to 6.

Figure 1:
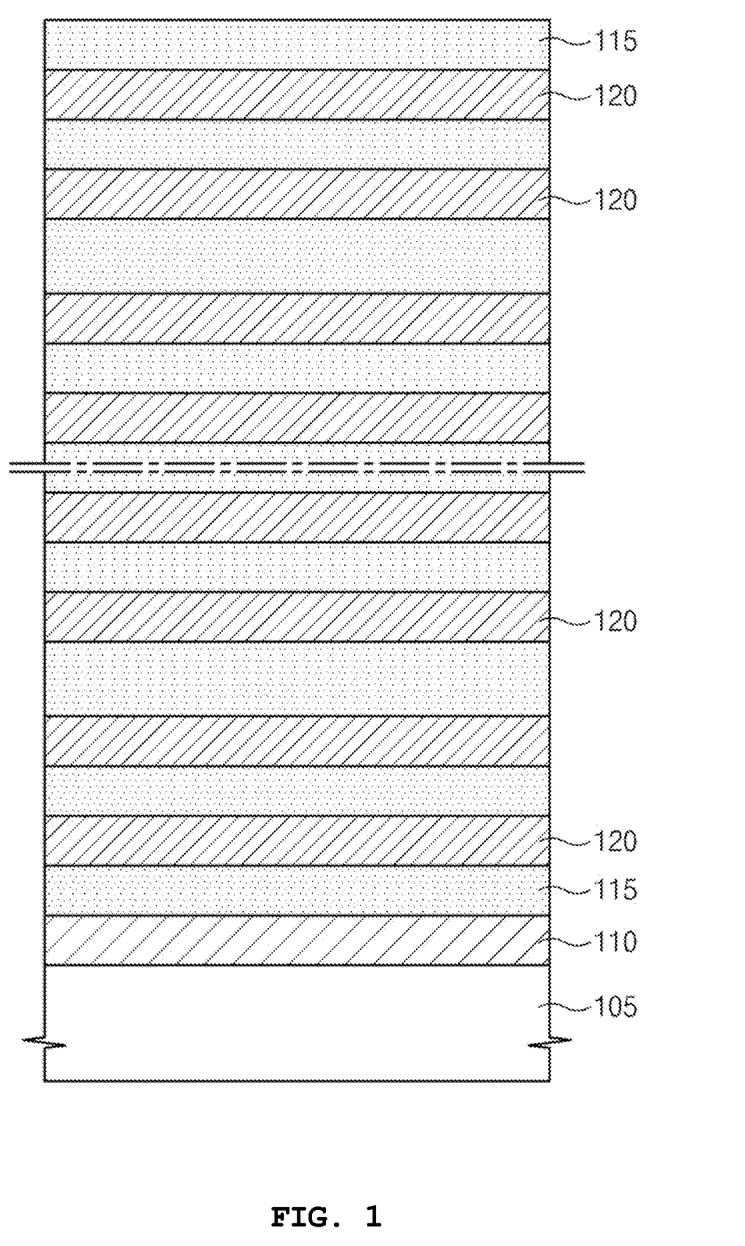
FIGS. 1 to 6 are schematic cross-sectional views illustrating a method for manufacturing a memory device according to an embodiment of the present invention.

First, as shown in FIG. 1, a substrate 105 may be prepared. The substrate 105 may be formed of a semiconductor material, for example, the group IV semiconductor, the group III-V compound semiconductor, or the group II-VI oxide semiconductor. For example, the group IV semiconductor may include silicon, germanium, or silicon-germanium. The substrate 105 may be provided as a bulk wafer or an epitaxial layer.

Next, impurities may be injected into an upper portion of the substrate 105 to define an impurity region 110. Then, insulation layers 115 and sacrificial layers 120 may be alternately stacked on the substrate 105. The insulation layers 115 and the sacrificial layers 120 may form an 8×8, 18×18, or n×n multilayer. Although the insulation layer 115 is stacked first, and then the sacrificial layer 120 is stacked in the current embodiment, the present invention is not limited thereto. For example, a stacking order of the insulation layer 115 and the sacrificial layer 120 may be changed.

The insulation layer 115 may be silicon dioxide ($SiO_2$). Silane ($SiH_4$) and nitrogen oxide ($N_2O$) which are supplied onto the substrate 105 may react with each other to form the insulation layer 115. The silane (SiH4) may be replaced with $Si_2H_6$, $Si_3H_8$, or $Si_4H_{10}$. Similarly, the sacrificial layer 120 may be silicon oxide. Dichlorosilane ($SiCl_2H_2$: DCS) and nitrogen oxide ($N_2O$) which are supplied onto the substrate 105 may react with each other to form the sacrificial layer 120. Also, unlike the current embodiment, the sacrificial layer 120 may be silicon oxide which is formed by supplying at least one gas selected from the group including $SiH_4$, $Si_2H_6$, $Si_3H_8$, $Si_4H_{10}$, and dichlorosilane ($SiCl_2H_2$) and at least one gas selected from the group including $B_2H_6$ and $PH_3$ onto the substrate 105. In this case, boron or phosphorus (alternatively, boron or phosphorus may be injected at the same time) may be injected into the silicon oxide.

Figure 2:
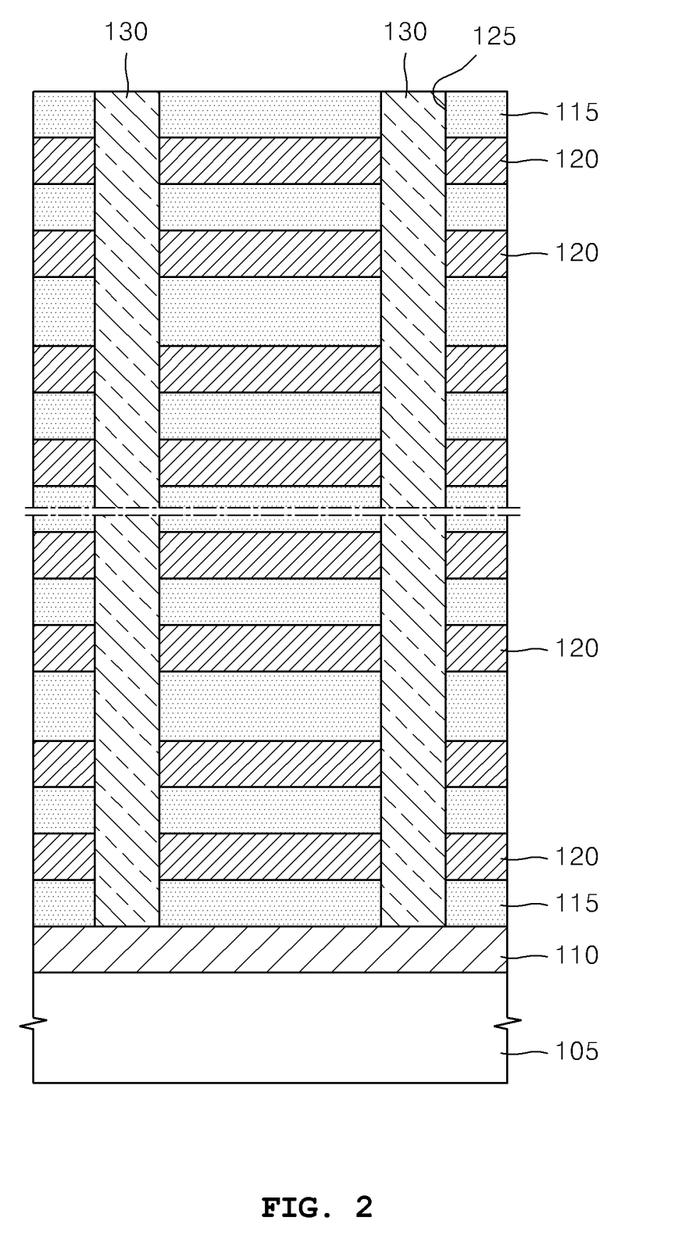

Next, as shown in FIG. 2, the insulation layers 115 and the sacrificial layer 120 may be etched to form a plurality of through holes 125. The through holes 125 pass through the insulation layers 115 and the sacrificial layers 120. The through holes 125 may be formed by using the known photolithography and etch techniques. Subsequently, patterns 130 for filling the through holes 125 may be formed through the previously known channel formation process (or a polysilicon thin film formation process) for forming a semiconductor transistor. Here, each of the patterns 130 may have an empty cylindrical shape. Similarly, the patterns 130 pass through the insulation layers 115 and the sacrificial layers 120. For example, each of the patterns 130 may have a polycrystal structure or a thin film shape such as the epitaxial layer having a monocrystal structure.

Figure 3:
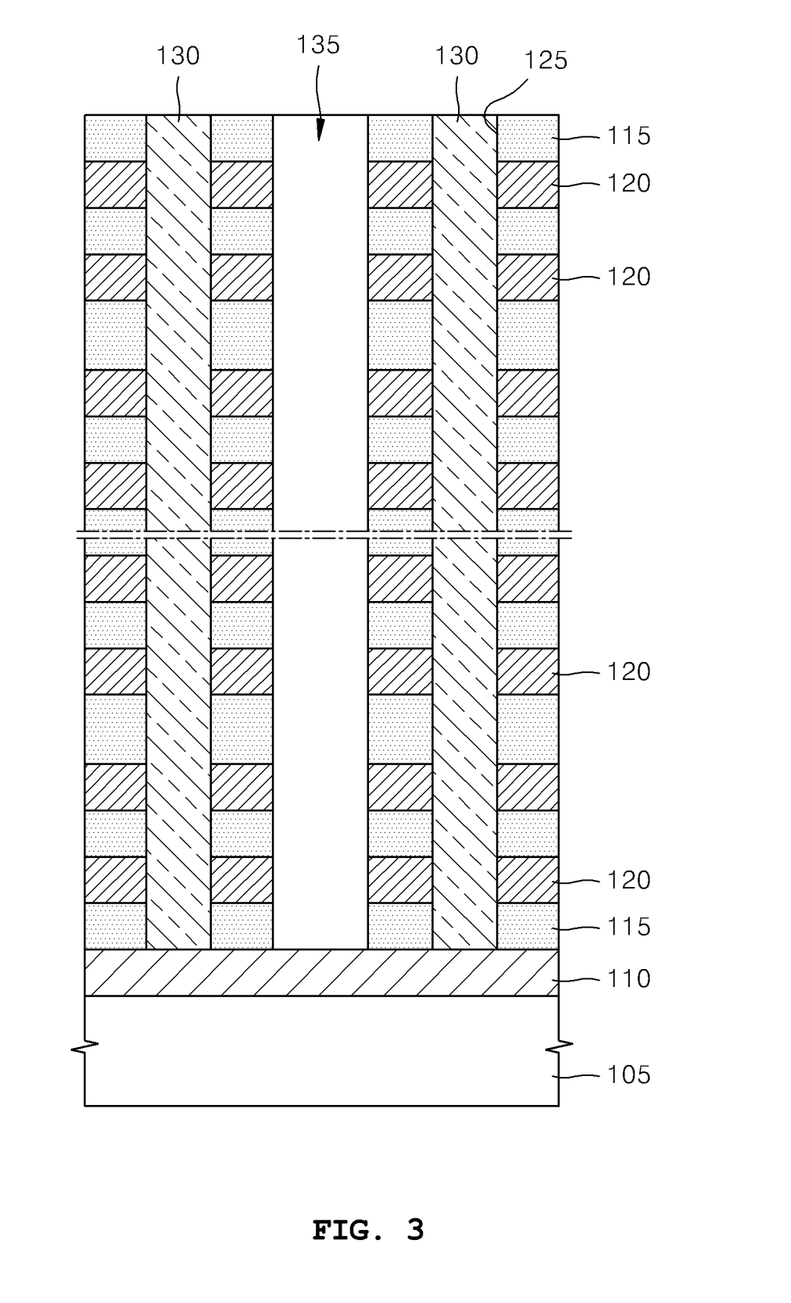

Then, as shown in FIG. 3, the insulation layers 115 and the sacrificial layers 120 between the patterns 130 may be etched to form openings 135. The openings 135 may be formed by using the photolithography and etch techniques.

Figure 4:
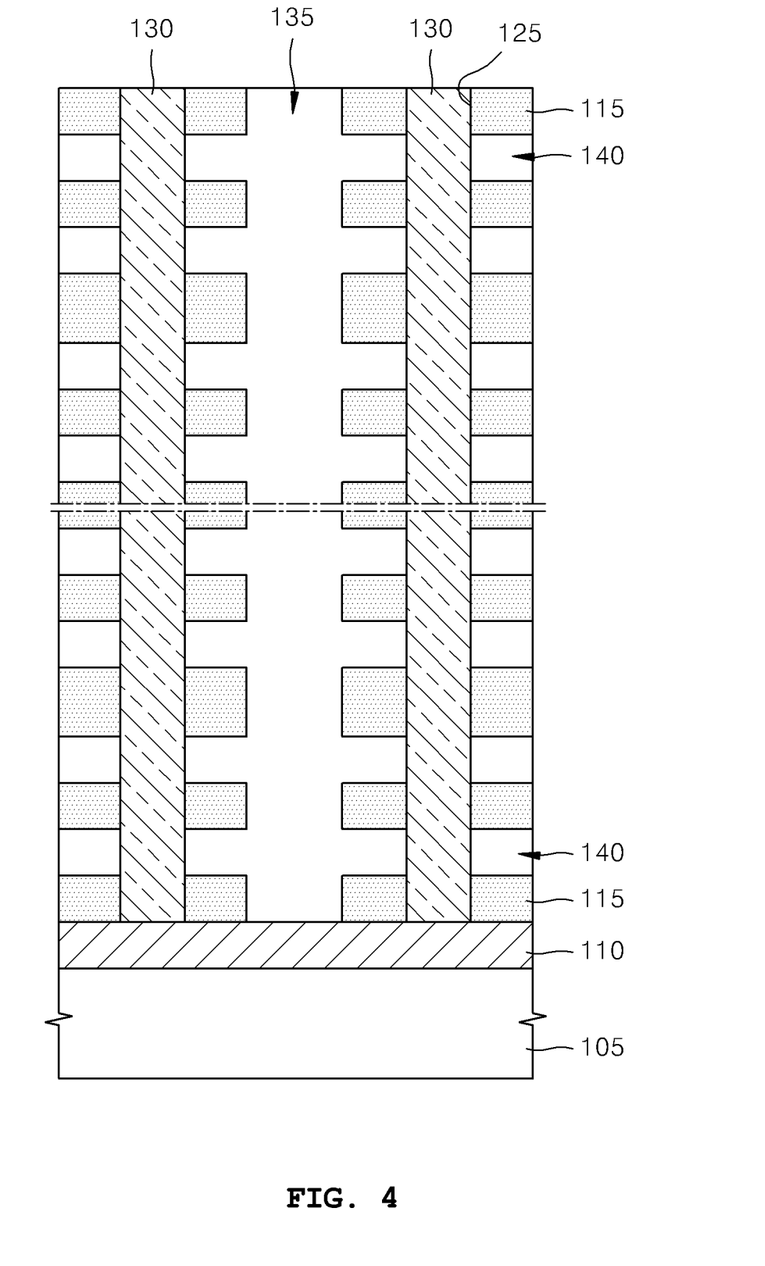

Next, as shown in FIG. 4, the sacrificial layers 120 may be removed. As described above, the insulation layer 115 may be silicon oxide which is formed by silane, and the sacrificial layer 120 may be silicon oxide which is formed by dichlorosilane or silicon oxide which is formed by supplying at least one gas selected from the group including $SiH_4$, $Si_2H_6$, $Si_3H_8$, $Si_4H_{10}$, and dichlorosilane ($SiCl_2H_2$) and at least one gas selected from the group including $B_2H_6$ and $PH_3$ and in which boron or phosphorus (alternatively, boron or phosphorus may be injected at the same time) is injected. Table 1 below represents characteristics of the silicon oxide formed by the silane and the silicon oxide formed by the dichlorosilane.

TABLE 1

| Film | (As Dep)E/R(HF)100:1(A/sec) |
|---|---|
| Silane-$SiO_2$ | 8.8 |
| DCS-$SiO_2$ | 223 |

As described in Table 1, the sacrificial layer 120 has etch selectivity with respect to the insulation layer 115. The sacrificial layer 120 has an etch rate greater by about 20 times than that of the insulation layer 115. Thus, when the insulation layer 115 and the sacrificial layer 120 are exposed to an etchant for the same time, the etched sacrificial layer 120 may have a size greater by about 20 times than that of the etched insulation layer 115. That is, an edged degree of the insulation layer 115 may be very less. Since silicon oxide having Cl group such as the silicon oxide formed by the dichlorosilane has relatively low deposition density of a thin film, the silicon oxide may have a relatively low etch rate.

The sacrificial layer 120 may be removed by using the above-described principle. The etchant may be permeated into the insulation layers 115 through the openings 135 by using isotropic etch. The isotropic etch may include wet etch or chemical dry etch. The etchant may include one of an HF solution and buffered oxide etch (BOE) solution. Thus, the sacrificial layers 120 between the insulation layers 115 may be removed to form tunnels 140 connected to the openings 135. Sidewalls of the patterns 130 may be exposed by the tunnels 140.

Figure 5:
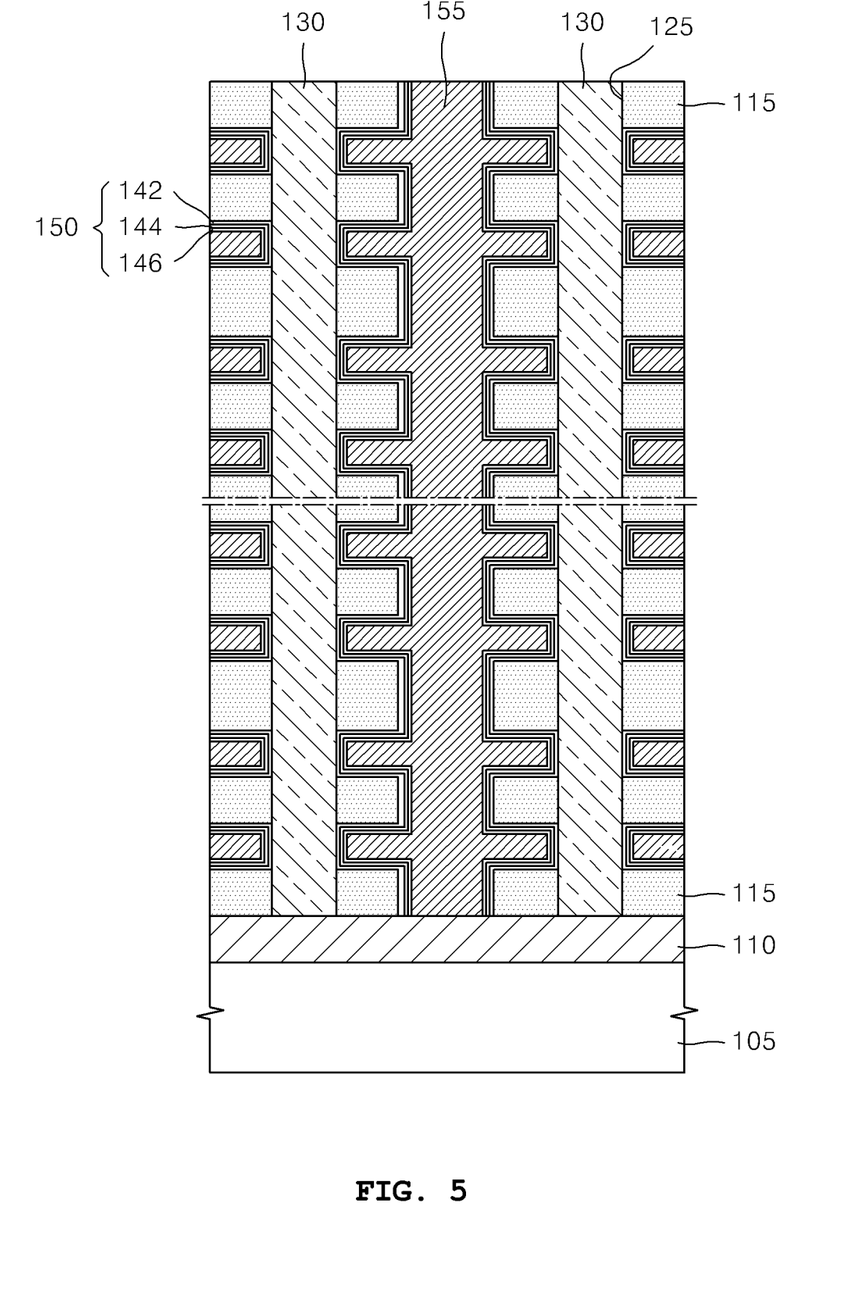
Figure 8:
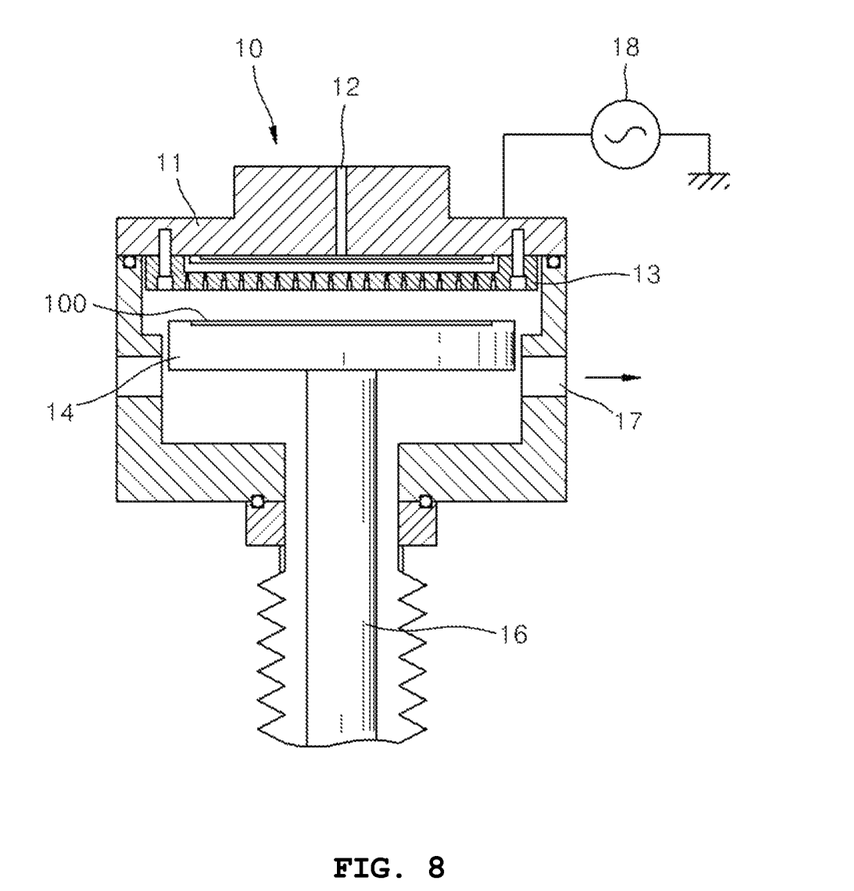
FIG. 8 is a schematic view of a semiconductor manufacturing apparatus according to an embodiment of the present invention.

Then, as shown in FIG. 5, storage media 150 may be formed on the insulation layers 115 and the sidewalls of the patterns 130 which are exposed by the openings (see reference numeral 135 of FIG. 8) and the tunnels (see reference numeral 140 of FIG. 8). The storage media 150 may include a tunneling insulation layer 142, a charge storage layer 114, and a blocking insulation layer 146 which are successively formed. Then, a conductive layer 155 may be formed on the storage media 150. For example, the storage media 150 and the conductive layer 155 may be formed by a chemical vapor deposition or plating method which has high step coverage.

Figure 6:
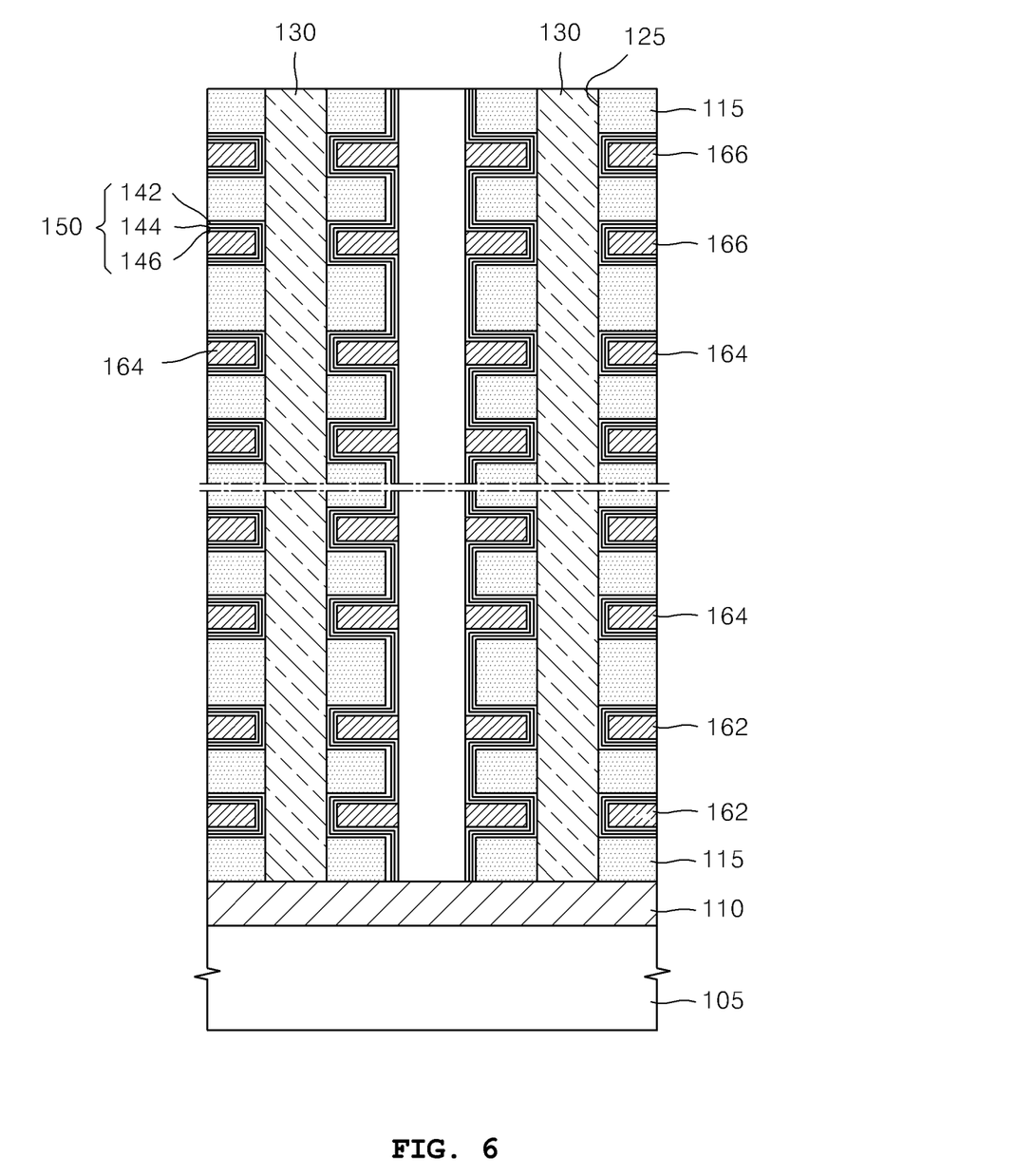

Then, as shown in FIG. 6, the conductive layer (see reference numeral 155 of FIG. 5) exposed by the openings (see reference numeral 135 of FIG. 4) may be selectively etched to form ground select gate electrodes 162, control gate electrodes 164, and string select gate electrodes 166.

Figure 7:
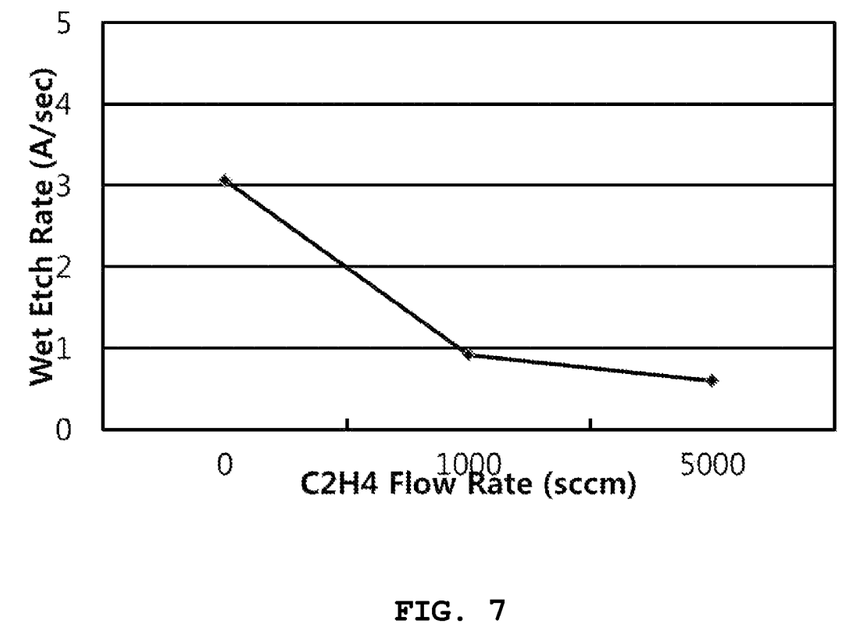
FIG. 7 is a graph illustrating a relationship between an ethyl-based gas flow rate and an etch rate of a deposited thin film.

Unlike the current embodiment, an ethyl-based gas (e.g., $C_2H_4$) or a methyl-based gas (e.g., $CH_3$) may be supplied together with silane ($SiH_4$). Thus, the insulation layer 115 may be a silicon carbon oxide (SiCO) thin film. Since the insulation layer 115 formed of the SiCO thin film has relatively large etch selectivity than the sacrificial layer 120 formed by the above-described dichlorosilane, when the sacrificial layer 120 is removed, damage of the insulation layer 115 may be minimized. FIG. 7 is a graph illustrating a relationship between an ethyl-based gas flow rate and an etch rate of a deposited thin film. As shown in FIG. 7, as the ethyl-based gas is supplied, it is seen that the deposited thin film is decreased in etch rate. Thus, etch selectivity with respect to the sacrificial layer 120 may be adjusted as necessary.

MODE FOR CARRYING OUT THE INVENTION

FIG. 8 is a schematic view of a semiconductor manufacturing apparatus according to an embodiment of the present invention. Referring to FIG. 8, a semiconductor manufacturing apparatus 10 includes an introduction part 12 through which a source gas or reaction gas is introduced. The source gas or reaction gas may be introduced through the introduction part 12 and then injected into the chamber 11 through a showerhead 13. When the process is performed, silane or dichlorosilane may be supplied at a flow rate of about 1 sccm to about 1,000 sccm. Also, the reaction gas (e.g., $N_2O$) may be supplied at a flow rate of about 1 sccm to about 50,000 sccm. As described above, when an ethyl-based gas (e.g., $C_2H_4$) or a methyl-based gas (e.g., $CH_3$) is supplied, the ethyle-based gas or the methyl-based gas may be supplied at a flow rate of about 50 sccm to about 1,000 sccm.

The substrate 15 that is a process target is placed on a top surface of a heater 14, and the heater 14 is supported by a heater support 16. The heater 14 may maintain the substrate at a temperature of about 300° C. to about 790° C. while the process is performed. Here, the inside of the chamber may be maintained at a pressure of about 10 mTorr to about 250 Torr. The processed substrate 15 is unloaded to the outside through the discharge part 17.

Figure 9:
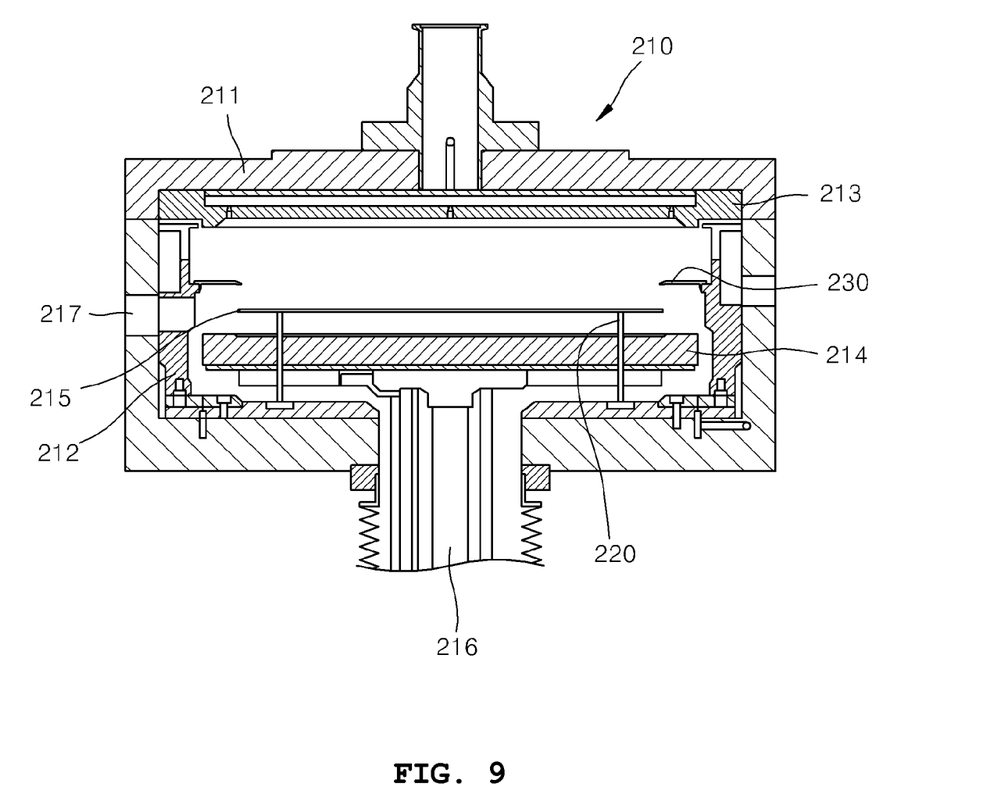
FIG. 9 is a schematic view illustrating an apparatus for manufacturing a memory device according to another embodiment of the present invention.
Figure 10:
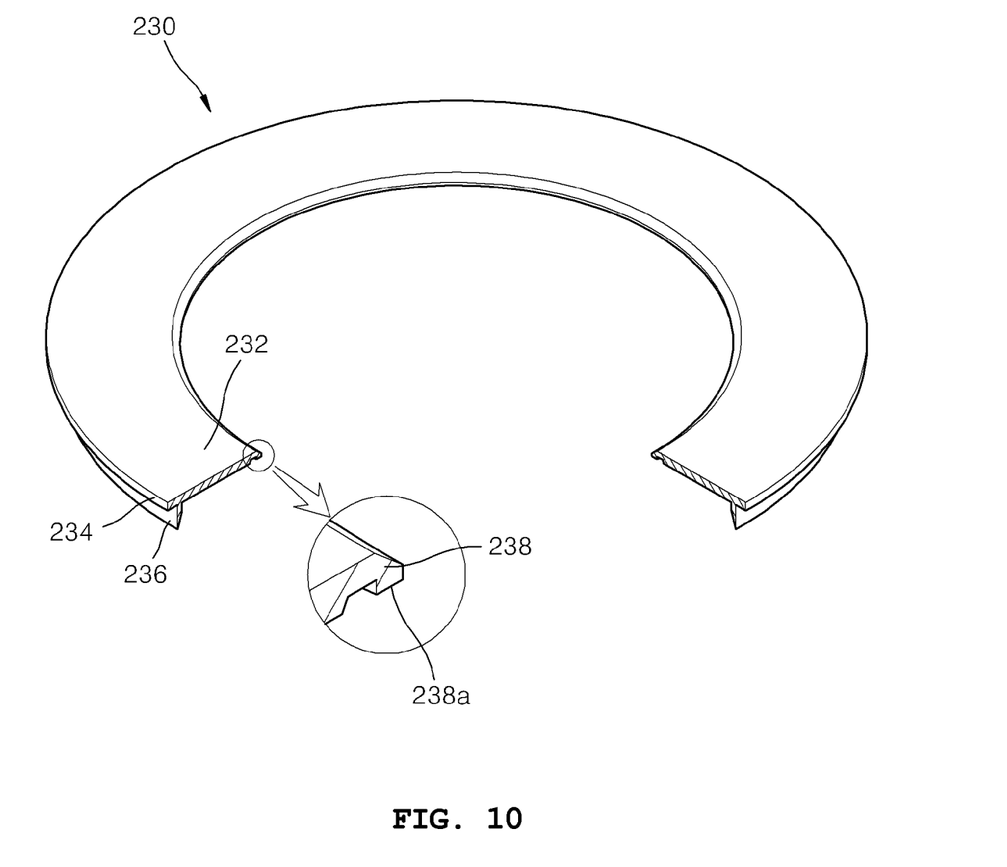
FIG. 10 is a schematic perspective view illustrating an edge ring of FIG. 9.

FIG. 9 is a schematic view illustrating an apparatus for manufacturing a memory device according to another embodiment of the present invention. FIG. 10 is a schematic perspective view illustrating an edge ring of FIG. 9. Hereinafter, only configurations different from those of FIG. 8 will be described, and thus omitted descriptions herein may be substituted for the descriptions of FIG. 8.

Referring to FIG. 9, an apparatus for manufacturing a memory device includes a substrate support 214 installed within a chamber 211. The substrate support 214 is supported by a support 216. As described later, the substrate support 214 is lifted together with the support 216 by a separate driving part (not shown). Thus, the substrate 215 may be converted between a release position (see FIG. 9) at which the substrate 215 is loaded into or unloaded from the chamber 211 and a process position (see FIG. 11) at which processes with respect to the substrate 215 are performed.

The substrate 215 may be loaded into or unloaded from the chamber 211 through a discharge part 217 defined in a sidewall of the chamber 211. The substrate 215 loaded into the chamber through the discharge part 217 is placed on a top surface of the substrate support 214. The substrate support 214 may have a diameter greater than that of the substrate 215. The substrate 215 is disposed at a center of the substrate support 214. Here, the substrate 215 is supported by a lift pin 220 passing through the substrate support 214 and maintained in a state where the substrate 215 is lifted and spaced from the substrate support 214. Also, a showerhead 213 is disposed above the substrate support 214, and a source gas or reaction gas is injected into the chamber through the showerhead 213.

The chamber 211 further includes a vacuum guide 212 and an edge ring 230. The vacuum guide 212 has a cylindrical shape and is disposed within the chamber 211. As shown in FIG. 10, the edge ring 230 has a ring shape corresponding to an inner shape of the chamber 211. The edge ring 230 includes a support part 232, a horizontal support part 234, and a press part 238 having a press surface 238a. The edge ring 230 is disposed between the substrate support 214 and the showerhead 213 and placed on a fixing protrusion 212a protruding from an inner sidewall of the vacuum guide 212. As shown in FIG. 9, when the substrate support 214 is disposed at the release position, the edge ring 230 is disposed on the fixing protrusion 212a. As described later, when the substrate support is converted into the process position, the edge ring 230 is separated from the fixing protrusion 212a and then placed on the substrate support 214.

Figure 11:
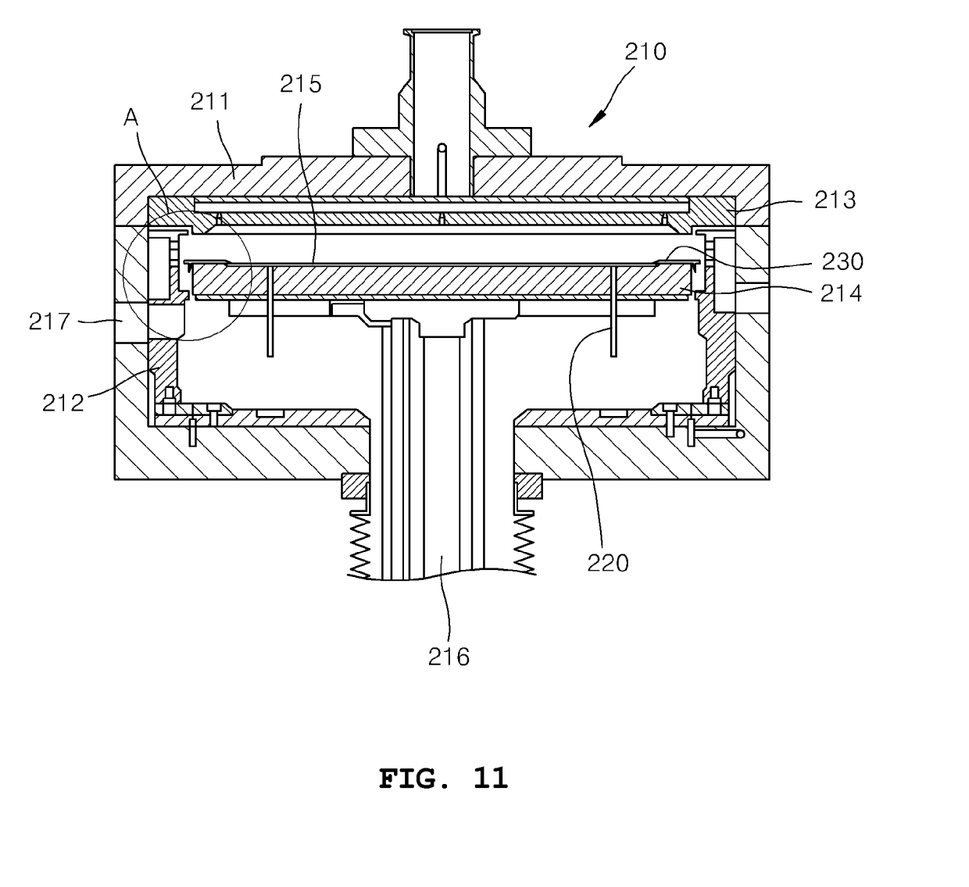
FIGS. 11 and 12 are views illustrating an operation of the edge ring of FIG. 9.
Figure 12:
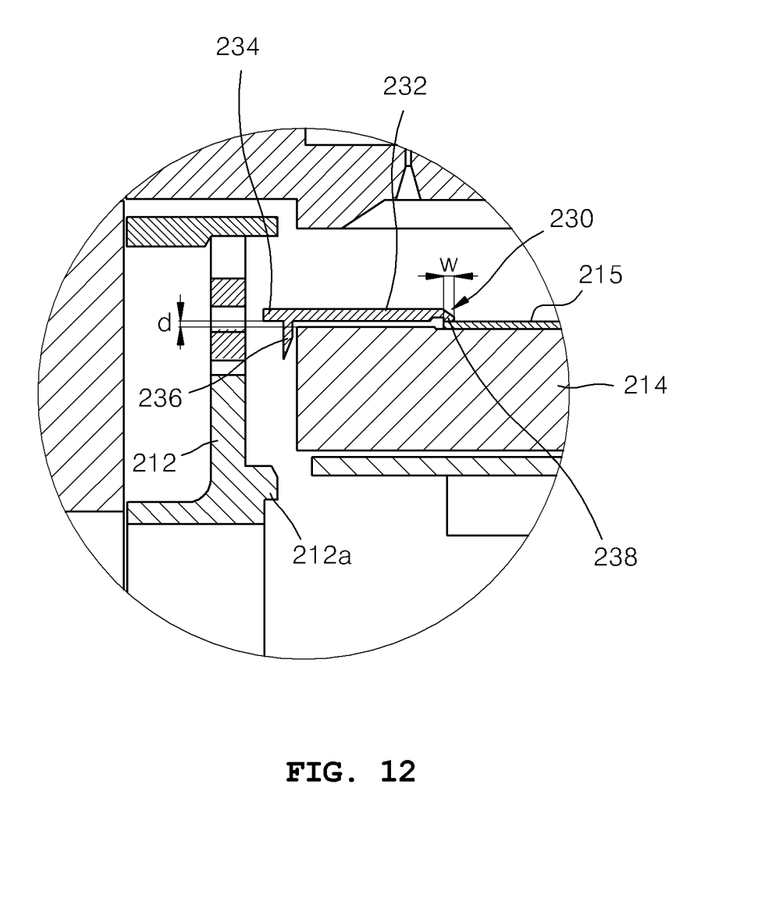

FIGS. 11 and 12 are views illustrating an operation of the edge ring of FIG. 9. As described above, the substrate support 214 is lifted together with the support 216 by a driving part (not shown). Thus, the substrate support 214 may be converted between the release position and the process position.

As shown in FIG. 12, the horizontal support part 234 extends from the support part 232 toward the sidewall of the chamber 211. The vertical support part 236 extends downward from the support part 232. The press part 238 extends inclinedly downward from the support part 232 toward the inside of the chamber 211.

As shown in FIG. 9, when the substrate support 214 is disposed at the release position, the edge ring 230 may be disposed on the fixing protrusion 212a by the horizontal support part 234 and the vertical support part 236. The horizontal support part 234 contacts a top surface of the fixing protrusion 212a, and the vertical support part 236 contacts a side surface of the fixing protrusion 212a. Here, the support part 232 and the press part 238 may be maintained in a state where the support part 232 and the press part 238 protrude toward the inside of the chamber 211.

As shown in FIG. 11, when the substrate support 214 is converted into the process position, the substrate support 214 lifts the edge ring 230 by using an edge part having a ring shape disposed outside the substrate 215. Thus, the edge ring 230 is separated from the fixing protrusion 212a to ascend. Here, as shown in FIG. 12, the support part 232 is adjacent to the edge part of the substrate support 214, and the press part 238 contacts the edge part of the substrate 215 placed on the substrate support 214 to press the edge part of the substrate 215. That is, the edge ring 230 presses the edge part of the substrate 215 by a self-weight in a state where the edge ring 230 is placed on the substrate support 214. The press part 238 has the press surface 238a contacting the edge part of the substrate 215.

As described in FIG. 1, when the silicon oxides different from each other are alternately stacked on the substrate, stress occurs between the two silicon oxides due to the process. Thus, warpage or twist of the substrate may occur. The edge part of the substrate may be spaced from the substrate support due to the deformation of the substrate. Here, the substrate may be deformed in a U shape in which a central portion of the substrate is recessed. This may have an influence on temperature distribution (between the central portion and the edge of the substrate) within the substrate, and thus have a great influence on process uniformity (e.g., a deposition rate). Actually, after the above-described processes are finished, it is seen that a deposition rate measured at the edge part of the substrate is significantly lower than that measured at the central portion of the substrate. Thus, to prevent the substrate from being deformed due to the separation of the edge part of the substrate from the substrate support, the edge part of the substrate 215 may be pressed by using the press part 238 of the edge ring 230.

As shown in FIG. 12, the edge part of the substrate 215 pressed by the press part 238 of the edge ring 230 may have a width w of about 0.5 mm to about 3 mm. Also, since this portion is not used as the semiconductor device in an actual semiconductor process, the pressed edge part does not have influence on yield of the semiconductor device. Also, the above-described press surface 238a may have a width w corresponding to that of the edge part.

As shown in FIG. 12, the edge ring 230 may be maintained through only the press part 236 in the state where the edge ring 230 is supported on the substrate support 214. The support part 232 may be maintained in a state where the support part 232 is spaced a predetermined distance d from the edge part of the substrate support 214. In this case, since the total weight of the edge ring 230 is transferred into the edge part of the substrate 215 through the press surface 238a of the press part 238, a high pressure may be transferred into the edge part of the substrate 215 even though the edge ring 230 is minimized in weight. This principle may be understood from a fact in which a pressure is in inverse proportion to a contact area.

INDUSTRIAL APPLICABILITY

The present invention may be applied in a method and apparatus for manufacturing various types of memory devices.

What is claimed is:

1. A method for manufacturing a semiconductor device having a 3-dimensional structure, the method comprising:
    stacking a plurality of insulation layers and a plurality of sacrificial layers alternately one another on a substrate;
    forming a through hole passing through the insulation layers and the sacrificial layers;
    forming a pattern filling the through hole;
    forming an opening passing through the insulation layers and the sacrificial layers; and
    supplying an etchant through the opening to remove the sacrificial layers,
    wherein the stacking of the insulation layers is performed by supplying at least one first gas selected from the group comprising $SiH_4$, $Si_2H_6$, $Si_3H_8$, and $Si_4H_{10}$ and at least one second gas selected from the group comprising an ethyl-based gas and methyl-based gas onto the substrate and by reacting the first gas and the second gas to deposit a silicon carbon oxide (SiCO), and
    the stacking of the sacrificial layers is performed by supplying dichlorosilane ($SiCl_2H_2$) onto the substrate to deposit a silicon oxide,
    the etchant comprises one of an HF solution and a buffered oxide etch (BOE) solution,
    the silicon carbon oxide (SiCO) of the insulation layers and the silicon oxide of the sacrificial layers have etch selectivity with respect to the etchant, and
    the silicon oxide of the sacrificial layers has an etch rate greater by about 5 times to about 300 times than that of the silicon carbon oxide (SiCO) of the insulation layers.

2. The method of claim 1, wherein during the stacking of the insulation layers and the sacrificial layers, the substrate is maintained at a temperature of about 300° C. to about 790° C. and at a process pressure of about 10 mTorr to about 250 Torr.

3. The method of claim 1, wherein the silicon carbon oxide (SiCO) and the silicon oxides have different thicknesses.

4. The method of claim 1, wherein the stacking of the insulation layers and the sacrificial layers further comprises pressing an edge part of the substrate by using an edge ring.

5. The method of claim 4, wherein the edge part of the substrate corresponds to a range of about 0.5 mm to about 3 mm from an edge of the substrate toward the inside of the substrate.

6. The method of claim 4, wherein the edge ring is formed of a ceramic material.

7. A method for manufacturing a semiconductor device having a 3-dimensional structure, the method comprising:
    stacking a plurality of insulation layers and a plurality of sacrificial layers on a substrate alternately one another;
    forming a through hole passing through the insulation layers and the sacrificial layers;
    forming a pattern filling the through hole;
    forming an opening passing through the insulation layers and the sacrificial layers; and
    supplying an etchant through the opening to remove the sacrificial layers,
    wherein the stacking of the insulation layers is performed by supplying at least one first gas selected from the group comprising $SiH_4$, $Si_2H_6$, $Si_3H_8$, and $Si_4H_{10}$ and at least one second gas selected from the group comprising an ethyl-based gas and methyl- based gas onto the substrate and by reacting the first gas and the second gas to deposit a silicon carbon oxide (SiCO),
    the stacking of the sacrificial layers is performed by supplying at least one third gas selected from the group comprising $SiH_4$, $Si_2H_6$, $Si_3H_8$, and $Si_4H_{10}$, and dichlorosilane ($SiCl_2H_2$) and at least one fourth gas selected from the group comprising $B_2H_6$ and $PH_3$ onto the substrate to deposit a silicon oxide in which boron or phosphorus is injected,
    the etchant comprises one of an HF solution and a buffered oxide etch (BOE) solution,
    the silicon carbon oxide (SiCO) of the insulation layers and the silicon oxide of the sacrificial layers have etch selectivity with respect to the etchant, and
    the silicon oxide of the sacrificial layers has an etch rate greater by about 5 times to about 300 times than that of the silicon carbon oxide (SiCO) of the insulation layers.

8. The method of claim 5, wherein the edge ring is formed of a ceramic material.

* * * * *